(12) United States Patent
Conte et al.

(10) Patent No.: US 12,212,320 B2
(45) Date of Patent: Jan. 28, 2025

(54) LEVEL SHIFTER CIRCUIT, CORRESPONDING DEVICE AND METHOD

(71) Applicants: STMICROELECTRONICS S.r.l., Agrate Brianza (IT); STMICROELECTRONICS (ALPS) SAS, Grenoble (FR)

(72) Inventors: Antonino Conte, Tremestieri Etneo (IT); Marco Ruta, San Gregorio di Catania (IT); Michelangelo Pisasale, Catania (IT); Thomas Jouanneau, St-Egreve (FR)

(73) Assignees: STMICROELECTRONICS S.r.l., Agrate Brianza (IT); STMICROELECTRONICS (ALPS) SAS, Grenoble (FR)

( * ) Notice: Subject to any disclaimer, the term of this patent is extended or adjusted under 35 U.S.C. 154(b) by 22 days.

(21) Appl. No.: 18/296,325

(22) Filed: Apr. 5, 2023

(65) Prior Publication Data
US 2023/0336176 A1    Oct. 19, 2023

(30) Foreign Application Priority Data

Apr. 14, 2022   (IT) .................. 102022000007508

(51) Int. Cl.
*H03K 19/20*     (2006.01)
*H03K 19/0185*   (2006.01)

(52) U.S. Cl.
CPC ..... *H03K 19/018521* (2013.01); *H03K 19/20* (2013.01)

(58) Field of Classification Search
None
See application file for complete search history.

(56) References Cited

U.S. PATENT DOCUMENTS

| 9,589,627 | B1 | 3/2017 | Wilson et al. |
| 11,606,030 | B1 * | 3/2023 | Kruiskamp ...... H03K 17/04123 |
| 2003/0042965 | A1 | 3/2003 | Kanno et al. |
| 2009/0302924 | A1 | 12/2009 | Kim |

* cited by examiner

*Primary Examiner* — Jeffrey S Zweizig
(74) *Attorney, Agent, or Firm* — Seed IP Law Group LLP

(57) ABSTRACT

A level-shifter circuit receives one or more input signals in an input level domain and includes provides at an output node an output signal in an output level domain shifted with respect to the input level domain. The circuit includes output circuitry including a first drive node and a second drive node that receive first and second logical signals so that the output signal has a first output level or a second output level in the output level domain as a function of at least one of the first and second logical signals. The circuit includes first and second shift capacitors coupled to the first and second drive nodes as well as capacitor refresh circuitry.

21 Claims, 4 Drawing Sheets

LEVEL SHIFTER CIRCUIT, CORRESPONDING DEVICE AND METHOD

BACKGROUND

Technical Field

The description relates to level shifter circuits, and more particularly to capacitor-based level shifter circuits.

Description of the Related Art

Performance and area of buffers in level shifter circuits can be optimized by using low-voltage devices up to twice their maximum voltage range. Cascoded structures are often used to extend the voltage range of metal-oxide-semiconductor (MOS) devices where fast shifting of the driving voltage is involved. Voltage shifting can be applied to cascoded buffers using a boosted clock. However, this approach is hardly suited to be applied in a continuous mode.

BRIEF SUMMARY

In one embodiment, a device includes at least one input node configured to receive an input signal in an input level domain and output circuitry including. The output circuitry includes an output node configured to provide an output signal in an output level domain, wherein the output level domain is shifted with respect to the input level domain, a first drive node configured to receive a first logical signal, and a second drive node configured to receive a second logical signal, wherein said output signal has a first output level or a second output level in said output level domain as a function of at least one of the first and second logical signals. The device includes a first shift capacitor coupled to the first drive node a second shift capacitor coupled to the second drive node, and capacitor refresh circuitry. The capacitor refresh circuitry includes a first refresh transistor having a control terminal as well as a first refresh current flow path therethrough between a supply node and the first shift capacitor via the first drive node, the first refresh current flow path configured to become conductive in response to a first refresh signal applied to the control terminal of the first refresh transistor. The capacitor refresh circuitry includes first logic circuitry configured to facilitate charge of the first shift capacitor via said first refresh current flow path in response to a first shifted refresh signal, said first shifted refresh signal being shifted with respect to the first refresh signal applied to the control terminal of the first refresh transistor. The capacitor refresh circuitry includes a second refresh transistor having a control terminal and a second refresh current flow path therethrough between a supply node and the second shift capacitor via the second drive node, the second refresh current flow path configured to become conductive in response to a second refresh signal applied to the control terminal of the second refresh transistor. The capacitor refresh circuitry includes second logic circuitry configured to facilitate charge of the second shift capacitor via said second refresh current flow path in response to a second shifted refresh signal, said second shifted refresh signal being shifted with respect to the second refresh signal applied to the control terminal of the second refresh transistor.

In one embodiment, a method includes receiving, with an input node of a circuit, an input signal in an input level domain, providing, with an output node of output circuitry of the circuit, an output signal in an output level domain shifted with respect to the input level domain, and receiving, with a first drive node of the output circuitry, a first logical signal. The method includes receiving, with a second drive node of the output circuitry, a second logic signal, wherein said output signal has a first output level or a second output level in said output level domain as a function of at least one of the first and second logical signals and causing a first refresh current path of a first refresh transistor to become conductive by applying a first refresh signal to a control terminal of the first refresh transistor, the first refresh current flow path being coupled between a supply node and a first shift capacitor coupled to the first drive node. The method includes charging, with first logic circuitry, the first shift capacitor via the first refresh current flow path in response to a first shifted refresh signal shifted with respect to the first refresh signal and causing a second refresh current path of a second refresh transistor to become conductive by applying a second refresh signal to a control terminal of the second refresh transistor, the second refresh current flow path being coupled between the supply node and a second shift capacitor coupled to the second drive node. The method includes charging, with second logic circuitry, the first shift capacitor via the second refresh current flow path in response to a second shifted refresh signal shifted with respect to the second refresh signal.

In one embodiment, a device includes an input node configured to receive an input signal in an input level domain, a supply terminal configured to provide a supply voltage, and output circuitry. The output circuitry includes a first cascode transistor, a second cascode transistor, and a first drive transistor coupled between the high supply node and the first cascode transistor and having a control terminal configured to receive a first logical signal. The output circuitry includes a second drive transistor coupled in parallel with the first drive transistor and having a control terminal configured to receive a second logical signal and an output node coupled between the first cascode transistor and the second cascode transistor and configured to provide an output signal in an output level domain shifted with respect to the input level domain.

In one embodiment is a low-voltage electronic device, such as a general-purpose (GP) microcontroller, utilizes a continuous operation mode.

Examples presented herein facilitate a continuous operation mode in capacitive level shifting where a shifted voltage is produced on capacitors used to propagate an input voltage to an, e.g., higher voltage domain.

Examples presented herein involve two p-channel metal-oxide semiconductor (PMOS) transistors, in the case of a cascoded buffer, or a NAND port, in the case of voltage domain shifting.

In both cases, the voltage on the capacitors is refreshed in such a way that no strict synchronization constraints are imposed between the input signal and the refreshing clock.

Examples as presented herein can be implemented using only low-voltage (LV) MOS components.

This facilitates efficient voltage domain changes and a fast propagation time of shifted voltage thanks to capacitor shifting.

Low consumption is likewise facilitated as no crossbar current occurs in response to level shifting.

BRIEF DESCRIPTION OF THE SEVERAL VIEWS OF THE DRAWINGS

One or more embodiments will now be described, by way of example only, with reference to the annexed figures, wherein.

Corresponding numerals and symbols in the different figures generally refer to corresponding parts unless otherwise indicated.

Figure 1:
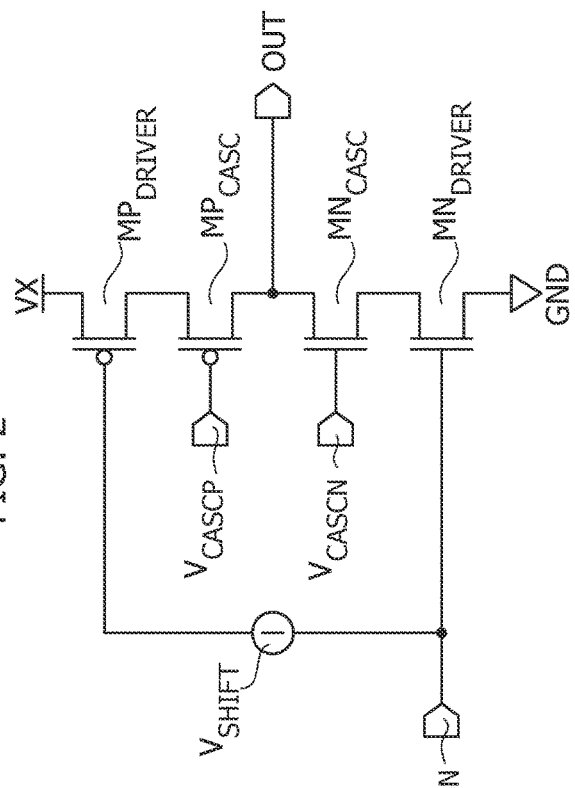
FIG. 1 is a circuit diagram of a level shifter circuit based on a cascoded configuration.

Also, throughout this description, a same designation may be used for brevity to designate:

a certain node or line as well as a signal occurring at that node or line, and a certain component (e.g., a capacitor or a resistor) as well as an electrical parameter thereof (e.g., capacitance or resistance/impedance).

DETAILED DESCRIPTION

In the ensuing description, various specific details are illustrated in order to provide an in-depth understanding of various examples of embodiments according to the description. The embodiments may be obtained without one or more of the specific details, or with other methods, components, materials, etc. In other cases, known structures, materials, or operations are not illustrated or described in detail so that various aspects of the embodiments will not be obscured.

Reference to "an embodiment" or "one embodiment" in the framework of the present description is intended to indicate that a particular configuration, structure, or characteristic described in relation to the embodiment is included in at least one embodiment. Hence, phrases such as "in an embodiment," "in one embodiment," or the like, that may be present in various points of the present description do not necessarily refer exactly to one and the same embodiment. Furthermore, particular configurations, structures, or characteristics may be combined in any adequate way in one or more embodiments.

The headings/references used herein are provided merely for convenience and hence do not define the extent of protection or the scope of the embodiments.

As discussed, performance and area of buffer circuits (briefly, buffers) can be improved by using low-voltage devices up to twice their maximum voltage range.

Cascoded structures are often used to extend the voltage range of metal-oxide-semiconductor (MOS) devices where fast shifting of the driving voltage is involved, in a scenario that becomes more beneficial in case of no availability of thick-oxide devices.

The designation cascode applies to a two-stage amplifier including a transconductance amplifier followed by a current buffer. A cascode includes two transistors (BJT or FET): one of these operates as a common emitter or common source and the other as a common base or common gate, with high input-output isolation, which effectively counters the Miller effect. A cascode arrangement is known to exhibit high input impedance, high output impedance, higher gain or higher bandwidth.

A high output impedance corresponds to a low sensitivity of the output current with respect to variations in the output voltage: that is, in view of Ohm's law, the higher the impedance, the lower the variations in the current. This is one of the reasons why cascode arrangements are used.

Producing voltage shifting with cascoded buffers via a boosted clock is known in the art. A prevailing understanding is that such an approach cannot be applied if continuous mode operation is envisaged.

Examples herein overcome limitations of boosted clock schemes and facilitating a continuous mode of operation in capacitive shifting.

By way of general reference, a level shifter circuit as illustrated in FIG. 1 includes a differential input port between input nodes $V_{GSP}$ (positive) and $V_{GSN}$ (negative) coupled to the control terminals (gates in the case of field-effect transistors such as MOSFETs) of two driver transistors $MP_{DRIVER}$ (p-channel) and $MN_{DRIVER}$ (n-channel).

The two driver transistors $MP_{DRIVER}$ and $MN_{DRIVER}$ are arranged with the current flow paths or channels therethrough (source-drain in the case of field-effect transistors such as MOSFETs) cascaded in a current flow line between a supply node at a voltage VX and a reference node (here ground, GND for simplicity).

Two further transistors in a (cascode) pair $MP_{CASC}$ (p-channel) and $MN_{CASC}$ (n-channel) are arranged with the current flow paths or channels therethrough (source-drain in the case of field-effect transistors such as MOSFETs) in the current flow line between the supply node VX and the reference node GND.

The control terminals (gates in the case of field-effect transistors such as MOSFETs) of the two cascode transistors $MP_{CASC}$ and $MN_{CASC}$ are configured to receive respective bias (voltage) signals $V_{CASCP}$ and $V_{CASCN}$.

As illustrated in FIG. 1, the current flow line between the supply node VX and the reference node GND thus includes the cascaded arrangement of the current flow paths (source-drain in the case of field-effect transistors such as MOSFETs) of:

the first driver transistor $MP_{DRIVER}$,
the first cascode transistor $MP_{CASC}$,
the second cascode transistor $MN_{CASC}$, and
the second driver transistor $MN_{DRIVER}$.

An output node OUT is located on the current flow line between the supply node VX and the reference node GND intermediate the two cascode transistors $MP_{CASC}$ and $MN_{CASC}$.

FIG. 1 (and the other circuit diagrams discussed herein) are illustrative of a field-effect (MOSFET) implementation. A bipolar junction transistor (BJT) implementation of all the circuits discussed in the present description is likewise possible. In such a BJT implementation, the control terminal will be the base of these transistors and the current path therethrough will be represented by the emitter-collector current flow path.

In implementations as considered herein, VX is assumed to be a positive voltage, with the polarities of the transistors (p-channel/n-channel) selected correspondingly. Those of skill in the art can easily devise a corresponding adaptation of polarities in case VX is a negative voltage.

By referring to exemplary, non limiting quantitative figures, assuming an MVR=Maximum Voltage Rating for ten years (10 y), then, in a circuit as represented in FIG. 1:

VX~2.2V in case of suspended-gate (SG) MOSFETs (MVR~1.1V), $V_X$~3.6V in case of extended-gate (EG) MOSFETs (MVR~1.8V), VGSP range [$V_{CASCP}$; VX], with VX−$V_{CASCP}$<MVR, VGSN range [0; $V_{CASCN}$], with $V_{CASCN}$<MVR, and the cascoded driver allows VX up to 2*MVR.

The lifetime of transistors in a circuit as illustrated is determined by their drain-source voltage Vds and their gate-source voltage Vgs, for which it is beneficial be below the MVR value for each transistor individually. This applies to $MP_{DRIVER}$, $MN_{DRIVER}$ and to $MP_{CASC}$, $MN_{CASC}$ as well.

Lifetime can be more than 10 y if |$V_{GSP}$|<$V_X$−MVR and $V_{GSN}$<MVR.

Figure 2:
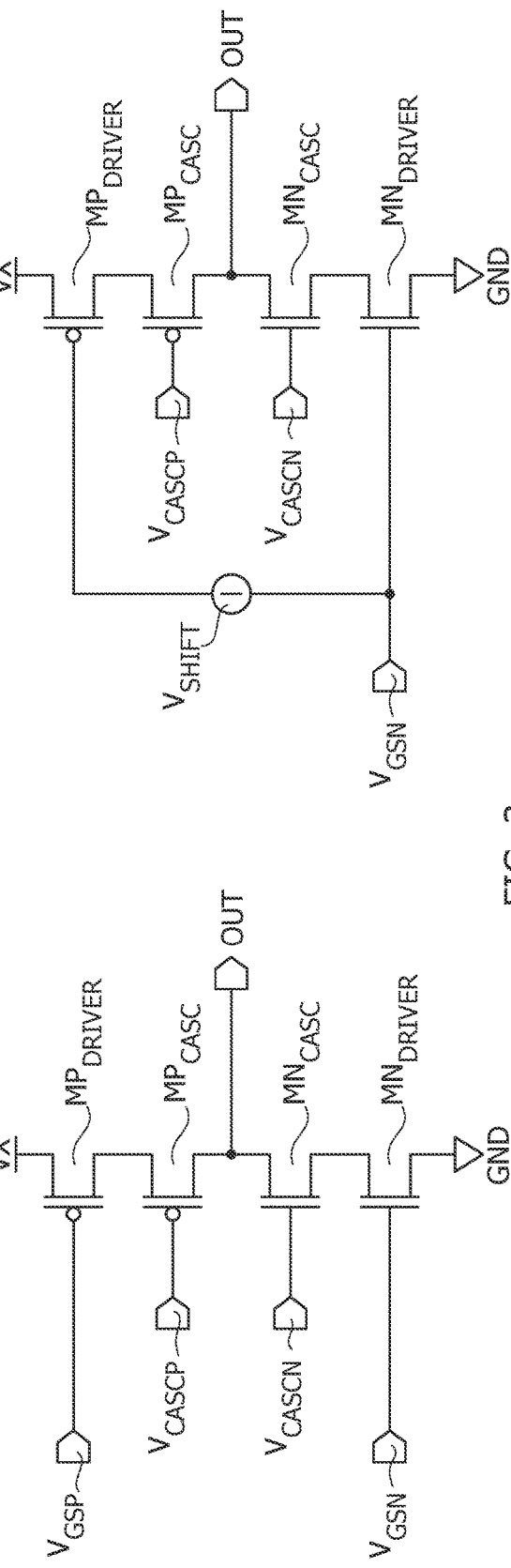
FIGS. 2 and 3 are circuit diagrams useful in comparing ideal voltage shift operation with practical implementations of a circuit as illustrated in FIG. 1.
Figure 3:
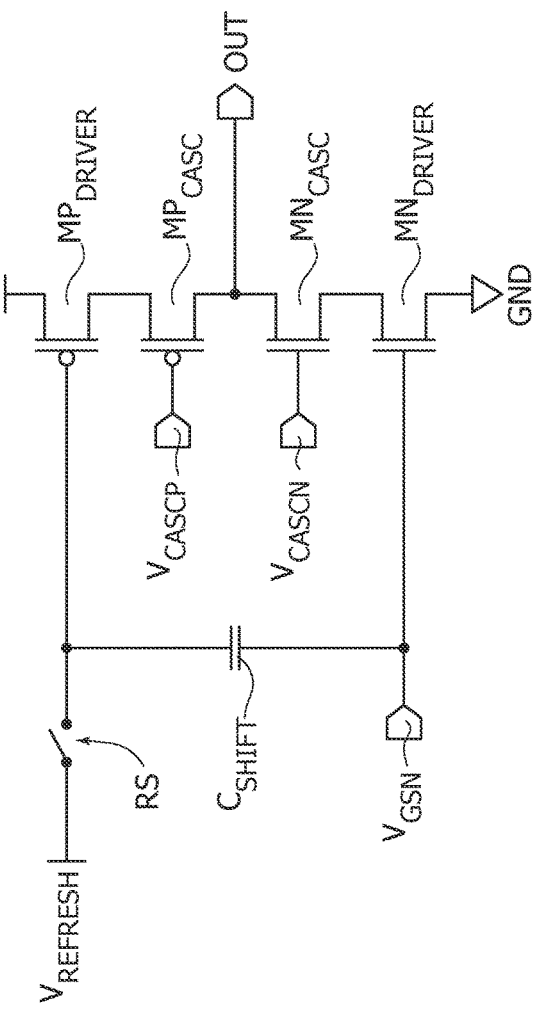

FIGS. 2 and 3 are circuit diagrams useful in comparing ideal voltage shift operation of a circuit as illustrated in FIG. 1 with a practical realization of the same circuit.

Corresponding numerals and symbols in FIGS. 1 to 3 refer to corresponding parts and a detailed description will not be repeated for FIGS. 2 and 3 for the sake of brevity.

FIG. 2 is exemplary of fast shifting via an ideal constant voltage generator $V_{SHIFT}$ added to $V_{GSN}$.

A constant value for $V_{SHIFT}$ is desired and VX is also a constant (high voltage) supply while $V_{GSN}$ can vary because it is the input signal of the level shifter. $V_{SHIFT}$ can thus be constant, because equal to a constant node voltage (namely, VX) minus another constant node voltage (namely $V_{CASCN}$).

This is of course only an example of generating the voltage $V_{SHIFT}$ In this example, this functionality is facilitated by the fact that, when $V_{GSN}$ is at '1' logic level, that is, at $V_{CASCN}$ voltage, the $MP_{DRIVER}$ gate will be at $V_{GSN}$+$V_{SHIFT}$=$V_{CASCN}$+VX−$V_{CASCN}$=VX. As a result, this $MP_{DRIVER}$ P-MOS has a Vgs of 0V and is therefore well shut-off (non conductive). There is therefore no conflict with the $MN_{DRIVER}$ MOSFET that is in 'on' state, because its Vgs ($V_{GSN}$) is high enough ($V_{CASCN}$), and is able to discharge the OUT node to ground adequately.

On the contrary, when $V_{GSN}$ is low (logic '0' or close to GND reference), the transistor $MN_{DRIVER}$ is off (its VGS=0V). The transistor $MP_{DRIVER}$ instead has its gate voltage to $V_{GSN}$+$V_{SHIFT}$=GND+VX−$V_{CASCN}$=VX−$V_{CASCN}$ This voltage difference is enough to turn it on and allow it to charge the OUT node without entering in conflict with the transistor $MN_{DRIVER}$ that is off.

As illustrated in FIG. 3, such an ideal constant generator $V_{SHIFT}$ can be implemented via a shifting capacitor $C_{SHIFT}$, with the shifting voltage desirably maintained via an efficient refresh of the voltage $V_{SHIFT}$ (the voltage across the capacitor $C_{SHIFT}$) as provided by a refresh voltage source $V_{REFRESH}$ via a refresh switch RS.

This mode of operation may not be compatible with a level shifter expected to be ready to operate at any time, in a continuous way and/or when having to take into account a timing with respect to refreshing clock is undesirable.

Figure 4:
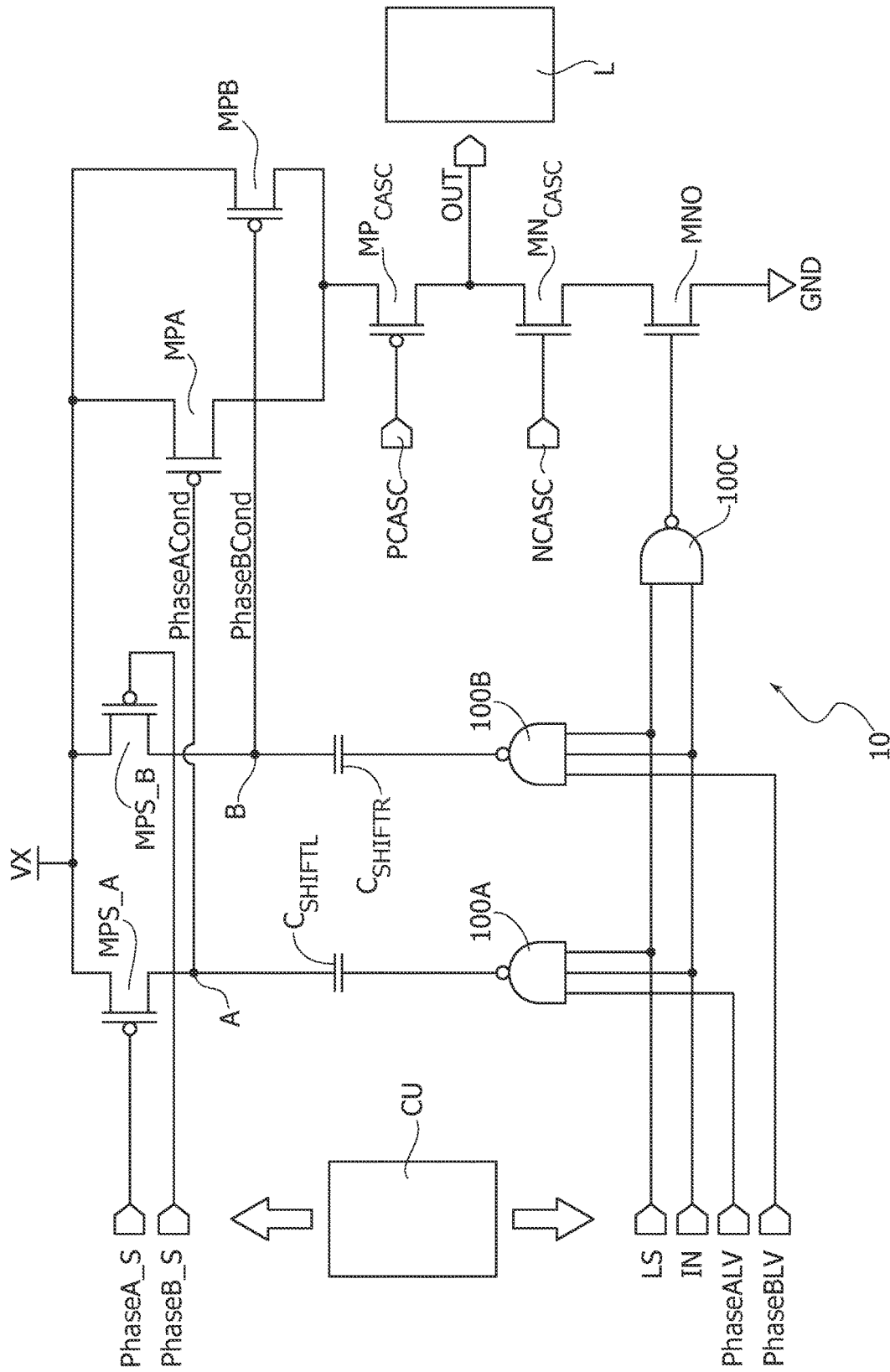
FIG. 4 is a circuit diagram illustrative of a first example as presented in this description, according to one embodiment.

The circuit diagram of FIG. 4 illustrates a possible way of addressing these issues by resorting to a low-voltage buffer (2V range) and low-voltage logic gates (e.g., NAND).

In a diagram of a circuit 10 as exemplified in FIG. 4 all components, including capacitors, can be low-voltage components with a reduced area occupancy due, e.g., to the transistors being all low-voltage transistors.

It is again recalled that, unless otherwise indicated, throughout the figures annexed to the present description, corresponding numerals and symbols in the different figures generally refer to corresponding parts.

A field-effect transistor implementation is referred throughout for simplicity where VX is assumed to be a positive voltage. A corresponding BJT implementation and/or adaptation of the polarities of the transistors in case VX is a negative voltage can be utilized without departing from the scope of the present disclosure.

In comparison with FIGS. 1 to 3, a circuit 10 as exemplified in FIG. 4 retains the cascode arrangement of the transistors $MP_{CASC}$ and $MN_{CASC}$ having the output node OUT therebetween while refresh circuitry is included configured to implement refresh phases (e.g., at 5 MHz).

As exemplified in FIG. 4, the first drive transistor $MP_{DRIVER}$ of FIGS. 1 to 3 is replaced by two (here p-channel MOSFET) transistors MPA, MPB arranged with the current flow paths therethrough (source-drain in the case of field-effect transistors such as MOSFETs as exemplified herein) coupled parallel to each other. Either of these current flow paths in parallel (when conductive) is thus capable of providing a section of a current flow line between the node VX and the reference node (here ground GND) through the cascode MOSFET transistors $MP_{CASC}$ (p-channel), $MN_{CASC}$ (n-channel) and the (n-channel) MOSFET transistor MNO. The transistor MNO is placed at the position of the transistor $MN_{DRIVER}$ in FIGS. 1 to 3.

The control terminals (gates in the case of field-effect transistors such as MOSFETs) of the two transistors MPA, MPB are coupled to nodes designated A and B to receive therefrom respective signals PhaseACond and PhaseBCond.

The signal/line PhaseACond drives the gate of the transistor MPA and is connected at a node A to the drain of the transistor MPS_A and the capacitor $C_{SHIFTL}$.

The signal/line PhaseBCond drives the gate of the transistor MPB and is connected at a node B to the drain of the transistor MPS_B and the capacitor $C_{SHIFTR}$.

It will be appreciated that the transistors MPS and MPB could be swapped with no effect on the circuit functionality as described.

The nodes A and B are coupled to respective drive transistors MPS_A and MPS_B.

Specifically, the transistor MPS_A is arranged with the current path therethrough (source-drain in the case of field-effect transistors such as MOSFETs) between the supply node VX and the node A. The node A is in turn coupled (on the opposite side with respect to the transistor MPS_A) to a first terminal of a shift capacitor $C_{SHIFTL}$.

The opposite, second terminal of the capacitor $C_{SHIFTL}$ is coupled to the output of a NAND gate 100A having inputs LS, IN and PhaseALV.

The transistor MPS_B is arranged with the current path therethrough (source-drain in the case of field-effect transistors such as MOSFETs) between the supply node VX and the node B. The node B is in turn coupled (on the opposite side with respect to the transistor MPS_B) to a first terminal of a further shift capacitor $C_{SHIFTR}$.

The opposite, second terminal of the capacitor $C_{SHIFTR}$ is coupled to the output of a NAND gate 100B having inputs LS, IN and PhaseBLV.

The control terminals (gates in the case of field-effect transistors such as MOSFETs) of the two transistors MPS_A and MPS_B are configured to receive respective signals PhaseA_S and PhaseB_S.

As illustrated in FIG. 4, the control terminal (gate in the case of field-effect transistors such as a MOSFET) of the transistor MNO placed at the position of the transistor $MN_{DRIVER}$ in FIGS. 1 to 3) is coupled to the output of a NAND gate 100C having inputs LS, IN.

By way of comparison with FIGS. 1 to 3, in FIG. 4 the current flow line between the supply node VX and the reference node GND extends through the cascaded arrangement of the current flow paths (source-drain in the case of field-effect transistors such as MOSFETs) of:
  the two transistors MPA and MPB, arranged with their current flow paths in parallel to each other,
  the first cascode transistor $MP_{CASC}$,
  the second cascode transistor $MN_{CASC}$, and
  the transistor MNO The output node OUT is again located intermediate the two cascode transistors $MP_{CASC}$ and $MN_{CASC}$.

The block CU in FIG. 4 is representative of logic circuitry (e.g., a simple finite state machine—FSM) that can be coupled to the circuit 10 and configured to generate signals to operate the circuit 10 to supply a load L (e.g., a cascaded buffer) coupled to the output node OUT based on the following Table I.

Either or both of the logic circuitry CU and the load can be distinct elements from the circuit 10, to be coupled to the circuit 10 in a final device such as a low-voltage electronic device, such as a general-purpose (GP) microcontroller for which a continuous operation mode is envisaged.

TABLE I

Signals involved in operation of the circuit 10

| Signal | Range [V] | Comments |
|---|---|---|
| VX | 0.8 V/2 V | Voltage range for buffer operation |
| LS | 0/VDD | Active high |
| PhaseALV | 0/VDD | Refresh A phase |
| PhaseBLV | 0/VDD | Refresh B phase |
| PhaseA_S | (VX – VDD)/VX | Shifted refresh A phase |
| PhaseB_S | (VX – VDD)/VX | Shifted refresh B phase |
| PCASC | VX – VDD | Static polarization PMOS cascode |
| NCASC | VDD | Static polarization NMOS Cascode |

The quantitative values in the table above are merely exemplary and non-limiting.

In Table I above, VDD denotes a voltage level (generally different from VX) indicative of a voltage domain, e.g., [0V; VDD] from which level shifting can take place towards another (shifted) voltage domain: e.g., in an implementation as illustrated, the output node OUT is varying between VX (when either node A or B is at VX–VDD to turn on either one of the PMOS transistors MPA or MPB, respectively), and the GND node.

Figure 5:
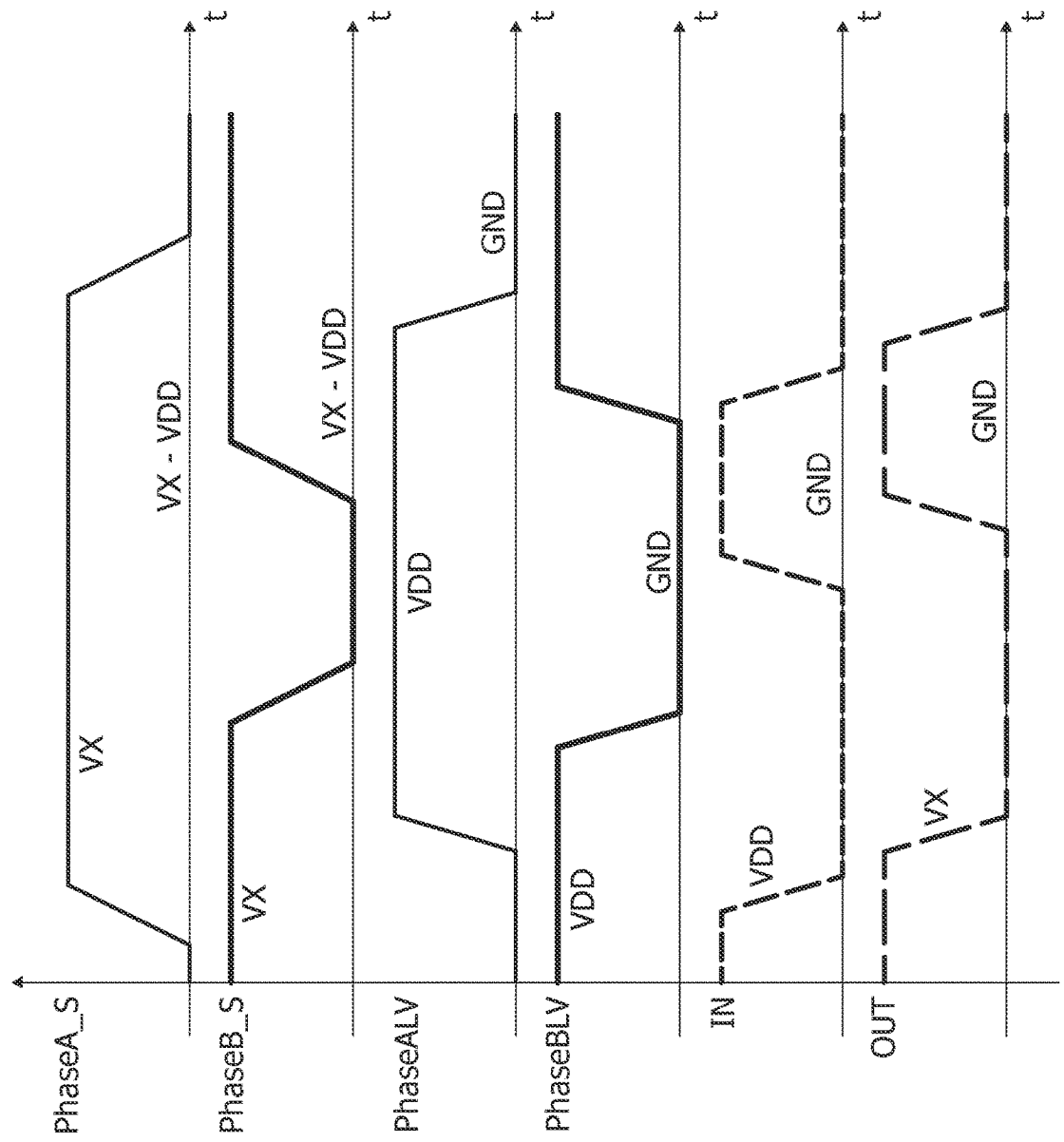
FIG. 5 is a diagram representing possible time behaviors of signals that may occur in an example as illustrated in FIG. 4, and according to one embodiment.

FIG. 5 is a diagram including various curves sharing a common time scale (abscissa t). These curves represent possible time behaviors of the following signals in a circuit 10 as illustrated in FIG. 4:
  PhaseA_S (control terminal of the transistor MPS_A);
  PhaseB_S (control terminal of the transistor MPS_B);
  PhaseALV (input to the NAND gate 100A);
  PhaseBLV (input to the NAND gate 100B);
  input signal IN (input to the NAND gates 100A, 100B and 100C); and
  output signal OUT at the output node intermediate the two cascode transistors $M_{PCASC}$ and $M_{NCASC}$.

Continuous operation of a level shifter circuit is facilitated by continuous refreshing of the voltages on the capacitors $C_{SHIFTL}$ and $C_{SHIFTR}$ with one capacitor (e.g., $C_{SHIFTR}$ resp. $C_{SHIFTL}$) refreshed while the other (e.g., $C_{SHIFTL}$ resp. $C_{SHIFTR}$) is ready to operate.

Only the refresh process on the capacitor $C_{SHIFTL}$ will now be described for the sake of simplicity, being otherwise understood that the same process can be performed mutatis mutandis on the other capacitor $C_{SHIFTR}$.

This refresh process involves locking the output of the NAND gate 100A at a high level (e.g., VDD) by controlling the PhaseALV signal to a low level (e.g., 0V). At the same time, the node A is driven to a high level (e.g., VX) by setting the PMOS transistor MPS_A to an 'on' (conductive) state. This is done by controlling the PhaseA_S signal to a low level (e.g., VX–VDD). In this way a voltage difference VX–VDD is produced between the two terminals of the capacitor $C_{SHIFTL}$.

At the end of the refresh phase, the gate 100A is unlocked by setting again the line PhaseALV to a high level (e.g., VDD), and the node A is disconnected from VX by controlling the line PhaseA_S to a high level (e.g., VX) to set the transistor MPS_A to an 'off' state.

During the refresh phase, the node A is at a high level (e.g., VX), setting the PMOS transistor MPA to an off mode, and therefore blocking its functionality in case the node OUT is charged to a high value. This is why the refreshing phases—where either PhaseALV is low (e.g., 0V) and PhaseA_S is low (e.g., VX–VDD), or PhaseBLV is low (e.g., 0V) and PhaseB_S is low (e.g., VX–VDD)—is non-overlapping, as described in the FIG. 5, to make sure at least one capacitor is able to act as a voltage source at any moment.

For instance:
  if IN=1 and LS=1, the (currently) non-refreshed capacitor terminal controlled by the output from the associated NAND gate 100A or 100B is pushed from a high voltage level (e.g., VDD) to a low voltage (e.g., 0V) level. The effect of the capacitor ($C_{SHIFTL}$ or $C_{SHIFTR}$) is to push down also the node A or B from high level (e.g., VX) to a low level (e.g., VX–VDD) and activate the associated PMOS driver (MPA or MPB) (made "on," that is, with the current flow path therethrough conductive). At the same time, the control terminal (gate in the case of field-effect transistors such as a MOSFET) of the transistor MNO is driven to low level (e.g., 0V) by the 100C NAND gate. The transistor MNO is therefore put in 'off' state. As a result, the OUT node is driven to a high value (e.g., VX).

If at least one of the signals IN or LS is at low value (e.g., 0V), both capacitors $C_{SHIFTR}$ and $C_{SHIFTL}$ are "pushed up" with the outputs from the associated NAND gates 100A and 100B set to a high level with both PMOS drivers MPA and MPB off, that is, with the current flow path therethrough non-conductive) while the transistor MNO is on (conductive).

In an arrangement as discussed herein, the inputs LS and IN play a same role and implement a NAND function at the input of the level shifter.

This is just one possible compact implementation of a level shifter with two inputs that are combined in an AND gate. The level shifting functionality could also operate with only one input (replacing the gate 100C with a simple inverter, and 100A and 100B with NAND gates with only two inputs). Operation can be with three (or more) inputs, based on the functionality desired at the input of the level shifter.

Thanks to the alternative and non-overlapping refresh of the capacitors $C_{SHIFTL}$ and $C_{SHIFTR}$, fast switching is thus facilitated with almost no crossbar consumption. The signals IN and LS can switch at any moment without any correlation with a refresh action; continuous mode operation is facilitated with no synchronization needed.

Figure 6:
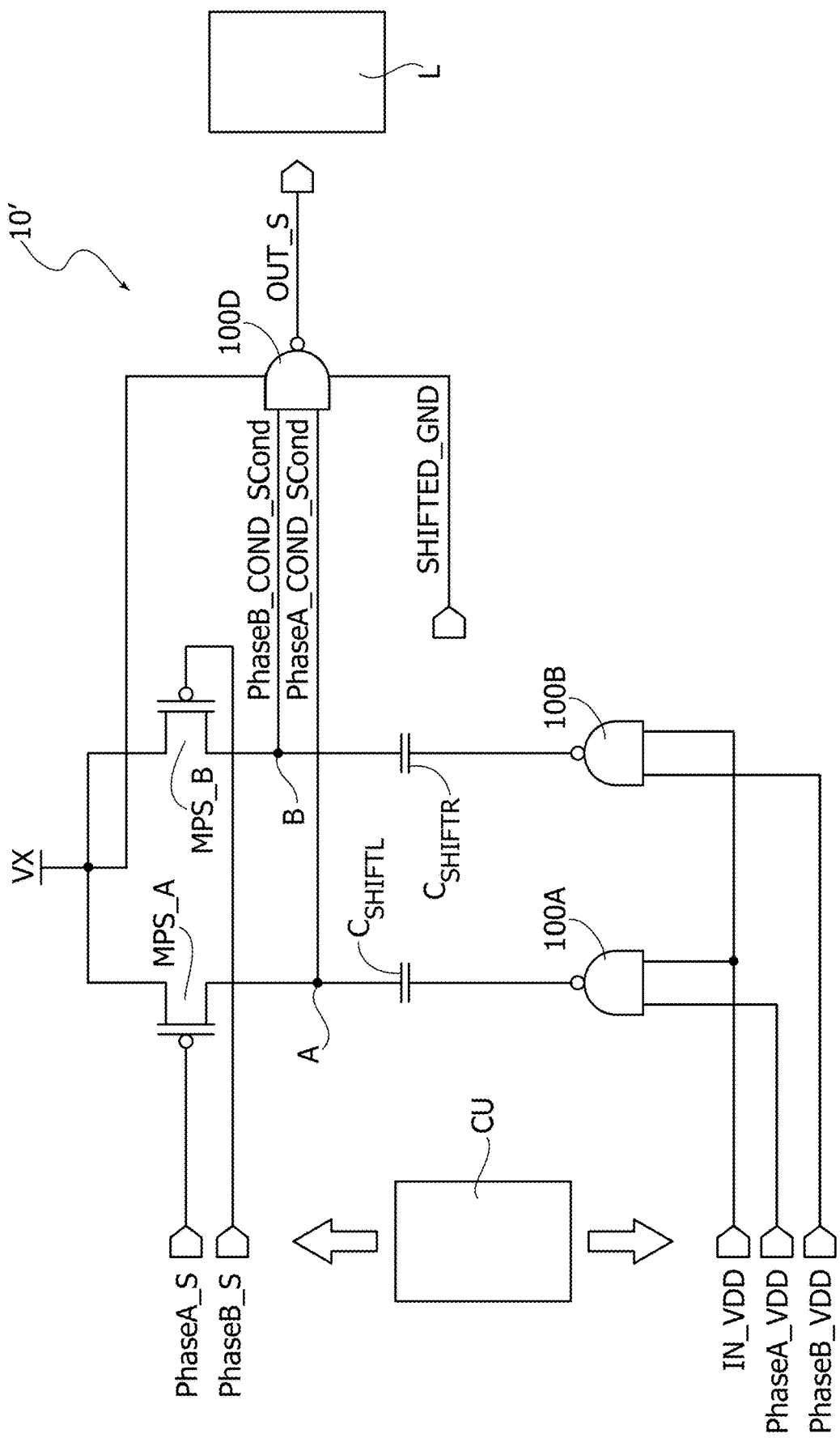
FIG. 6 is circuit diagram illustrative of a second example as presented in this description, according to one embodiment.

FIG. 6 is a circuit diagram illustrative of a second example of a level shifter circuit configured to operate on the basis of the criteria discussed in the foregoing in connection with FIGS. 4 and 5.

In FIG. 6, parts or elements like parts or elements already discussed in connection with the previous figures are indicated with like numerals and symbols. A corresponding detailed description will not be repeated for brevity.

Again, in a diagram as exemplified in FIG. 6 all components can be low-voltage components, e.g., suspended-gate (SG) MOSFET transistors in the case of Fully Depleted Silicon On Insulator, or FD-SOI technology.

The refresh/shift capacitors $C_{SHIFTL}$ and $C_{SHIFTR}$ can be low-voltage or with higher oxide thickness depending on the elevation voltage VX envisaged.

The diagram of FIG. 6 is exemplary of the possibility of using the same approach discussed in connection with FIGS. 4 and 5 to shift a signal from one voltage domain to another voltage domain.

An inverting configuration is illustrated by way of example in FIG. 6; those of skill in the art can however easily devise corresponding adaptations in case of a non-inverting configuration.

In a circuit 10' as exemplified in FIG. 6, the same refresh principle discussed previously in connection with FIGS. 4 and 5, with non overlapping phases that facilitate having the transistors MPS_A and MPS_B off (with the current flow path therethrough non-conductive) when the related refresh capacitor $C_{SHIFTL}$ or $C_{SHIFTR}$ is pushed down.

In fact, in a circuit 10' as exemplified in FIG. 6, refresh takes place in the same manner described previously, with line PhaseALV replaced by PhaseA_VDD and PhaseBLV replaced by PhaseB_VDD, respectively.

In a circuit 10' as exemplified in FIG. 6, the output signal applied to the load L (again, this may be a distinct element from the circuit 10') is the output signal OUT_S from a NAND gate 100D operating between the voltage VX and a reference node (e.g., a shifted ground SHIFTED_GND) and receiving as inputs:
 a first signal PhaseB_Cond_S from node A (between the transistor MPS_B and the capacitor $C_{SHIFTR}$)
 a second signal PhaseA_Cond_S from node B (between the transistor MPS_A and the capacitor $C_{SHIFTL}$).

A circuit 10' as exemplified in FIG. 6 facilitates achieving safe voltage conditions with inputs referred to the voltage levels VX and SHIFTED_GND.

In the circuit 10' as exemplified in FIG. 6 the two NAND gates 100A and 100B are two-input rather than three-input gates. It is again noted that an implementation with two input NAND gates is only an example. A level shifter with two (or more) inputs combined in a NAND gate depending on desired functionality is in fact feasible.

The two NAND gates 100A and 100B in FIG. 6 receive as inputs:
 an IN_VDD signal (input to both gates 100A and 100B),
 a signal PhaseA_VDD (input to gate 100B), and
 a signal PhaseB_VDD (input to gate 100A).

If IN_VDD=0 both inputs to the NAND gate 100D are high (e.g., VX) and OUT_S=SHIFTED_GND (logic 0).

If IN_VDD=1 at least one of the two inputs to the NAND gate 100D inputs is low and OUT_S=VX (logic 1).

Stated otherwise:
 if IN_VDD=1, the (currently) non-refreshed capacitor can be "pushed down" by the output from the associated NAND gate 100A or 100B to a low (e.g., zero) level and the associated PMOS driver (MPA or MPB) can be activated (on, that is, with the current flow path therethrough conductive);
 if IN_VDD=0 both capacitors $C_{SHIFTR}$ and $C_{SHIFTL}$ are "pushed up" with the outputs from the associated NAND gates 100A and 100B to a high level with both PMOS drivers MPA and MPB off, that is, with the current flow path therethrough non-conductive.

Both circuits 10 in FIGS. 4 and 10' in FIG. 6 can have either one or more input nodes, each one of them varying between a first input level or a second input level, namely (at least one) input node configured to receive an input signal (IN or IN_VDD) having a first input level or a second input level. Both circuits 10 and 10' include output circuitry (see MPA, MPB, $MP_{CASC}$, $MN_{CASC}$, MNO in FIG. 4 or 100D in FIG. 6) including an output node configured to provide an output signal (OUT or OUT_S) having a first output level or a second output level.

The circuits 10, 10' being level shifters involves the fact that the input signal(s) domain (range) is different from the output signal domain (range).

In the case of the circuit 10 of FIG. 4 one can refer, e.g., to the domain/range [GND, VDD] for the input signal(s), e.g., IN and LS in the case of FIG. 4 and to the domain/range [GND, VX] for the signal OUT in FIG. 5.

In the case of the circuit 10' of FIG. 6 one can refer, e.g., to the domain/range [GND, VDD] for the signal IN_VDD plus other possible input signals and to the domain/range [SHIFTED_GND, VX] for the signal OUT_S.

That is, each of the circuits described in either FIG. 4 or FIG. 6 can have both one or more input signals, depending on the functionality that is needed on the output signal.

The circuits 10, 10' being level shifters involves the fact that at least one of the first and second output levels (that define an output domain or range therebetween) is shifted with respect to the first and second input levels (that define an input domain or range therebetween).

On both circuits 10, 10' the output circuitry includes a first drive node (e.g., A) and a second drive node (e.g., B). These drive nodes are configured to receive first and second logical signals as represented by the signals PhaseACond and PhaseBCond in the circuit 10 of FIG. 4 and by the signals PhaseA_Cond_S, PhaseB_Cond_S in the circuit 10' of FIG. 6.

The output signal (OUT in FIGS. 4 and 5; OUT_S in FIG. 6) thus assumes a first output level or a second output level as a function of at least one of these logical signals.

In the circuit of FIG. 4, this takes place primarily via the logic signals PhaseACond, PhaseBCond at the nodes A and B driving the control terminals (gates) of the transistors MPA and MPB. The current flow paths through the transistors MPA and MPB, when conductive, activate the current flow line from the cascode transistors $MP_{CASC}$ and allows current to flow from the node VX to the node OUT. There is another current flow path from OUT to GND through $MN_{CASC}$ and the transistor MNO (made conductive by the NAD gate 100C).

Static current of this structure is expected to be (almost) zero, with the transistors MPA (or MPB) and MNO that are not conducting at the same time.

Either transistor MPA (or MPB) is conductive: this is the case when LS and IN input signals are high, meaning that the transistor MNO is not conducting (gate voltage is grounded by 100C).

In case the signals LS and IN are not simultaneously at a high level, MNO is conducting and activating the path from OUT to GND through $MN_{CASC}$. In the same time, the outputs of the NAND gates 100A and 100B are high, therefore nodes A and B are also high, setting the transistors MPA and MPB to an off state and interrupting (shutting off) the current path from VX to OUT.

As a result, OUT is discharged to GND. In the circuit of FIG. 6 the output signal OUT_S takes the value VX or the value SHIFTED_GND as a function of the output of the NAND gate 100D (high if either of the signals PhaseA_Cond_S, PhaseB_Cond_S is low and low if both signals PhaseA_Cond_S, PhaseB_Cond_S are high).

Both circuits 10, 10' include a first shift capacitor $C_{SHIFTL}$ and a second shift capacitor $C_{SHIFTR}$ that are coupled to the first drive node A and the second drive node B respectively.

Both circuits 10, 10' of FIGS. 4 and 6 also include capacitor refresh circuitry.

A first refresh transistor MPS_A has a control terminal (here, gate) as well as a first refresh current flow path therethrough (here, source-drain) between the supply node VX and the first shift capacitor $C_{SHIFTL}$ via the first drive node A.

As illustrated, the first refresh current flow path through the transistor MPS_A becomes conductive in response to a first refresh signal, PhaseA_S, applied to the control terminal of the transistor MPS_A. First logic circuitry (the NAND gate 100A) facilitates charge of the first capacitor $C_{SHIFTL}$ via the first refresh current flow path in response to a first shifted refresh signal (namely PhaseALV in FIGS. 4 and 5 or PhaseA_VDD in FIG. 6) that is (time) shifted with respect to the first refresh signal PhaseA_S applied to the control terminal of the transistor MPS_A.

A second refresh transistor MPS_B has a control terminal (here, gate) as well as a second refresh current flow path therethrough (here, source-drain) between the supply node VX and the second shift capacitor $C_{SHIFTR}$ via the second drive node B.

As illustrated, the second refresh current flow path through the transistor MPS_B becomes conductive in response to a second refresh signal, PhaseB_S, applied to the control terminal of the transistor MPS_B. Second logic circuitry (the NAND gate 100B) facilitates charge of the second capacitor $C_{SHIFTR}$ via the second refresh current flow path in response to a second shifted refresh signal (namely PhaseBLV in FIGS. 4 and 5 or PhaseB_VDD in FIG. 6) that is (time) shifted with respect to the second refresh signal PhaseB_S applied to the control terminal of the transistor MPS_B.

The control unit CU can be adequately configured (in a manner known to those of skill in the art) in such a way that the first/second shifted refresh signals (namely PhaseALV and PhaseBLV in FIGS. 4 and 5 or Phase A_VDD/in FIG. 6) is (time) shifted with respect to the first refresh signals (namely PhaseA_S and PhaseB_S).

In that way refresh phases (at 5 MHz, for instance) can be performed where (only) one capacitor (e.g., $C_{SHIFTR}$ or $C_{SHIFTL}$) is refreshed while the other (e.g., $C_{SHIFTL}$ or $C_{SHIFTR}$) is ready to operate, so that the refreshing phases are non-overlapping; and both capacitors $C_{SHIFTR}$ and $C_{SHIFTL}$ can be "pushed up" while both PMOS drivers MPA and MPB are off, that is, with the current flow path therethrough non-conductive.

The capacitor refresh circuitry is configured to counter the first refresh transistor MPS_A and the second refresh transistor MPS_B being made conductive simultaneously.

That is, in examples as discussed herein refresh is activated based on signals PhaseALV, PhaseA_VDD, PhaseBLV, PhaseB_VDD, PhaseA_S, PhaseB_S that can be considered "active low," which means that refresh is activated by having, e.g., the signals PhaseALV; PhaseA_VDD or the signals PhaseBLV; PhaseB_VDD at GND level, and having signals PhaseA_S or PhaseB_S that are sufficiently lower than VX (for example VX−VDD) to turn on either the transistors MPS_A or the transistor MPS_B, respectively and allow the charge of node A (or node B respectively) to VX while the other terminal of the capacitor $C_{SHIFTL}$ (or the capacitor $C_{SHIFTR}$ respectively) is bring to high value (for example VDD) by the logic gate 100A (or 100B respectively).

A point to be noted is that refresh is not activated at the same time for both capacitors $C_{SHIFTL}$ and $C_{SHIFTR}$, so that it is non-overlapping.

As the refresh control signals are "active low," these are high at the same time in between the refresh phases of the two capacitors, to counter any undesired refresh occurring during this period.

Solutions as presented herein facilitate high-speed shifting in cascoded structures (FIG. 4) or in voltage domain shifting (FIG. 6).

Solutions as presented herein can adopt low-voltage MOS devices that facilitate fast buffer operation at twice the MVR of MOS transistors in cascoded structures.

Solutions as presented herein facilitate efficient voltage domain change by using of low-voltage MOSFET transistors (only) obtaining a fast propagation time.

Major advantages of the solutions presented herein include low area, possible use of low-voltage MOSFET transistors (LV MOS) only, high performance in terms of speed (fast propagation time of shifted voltages facilitated by capacitor shifting) and reduced consumption (no crossbar current in level shifting).

Without prejudice to the underlying principles, the details and embodiments may vary, even significantly, with respect to what has been described by way of example only without departing from the extent of protection.

A circuit (10, 10'), may be summarized as including at least one input node configured to receive an input signal (IN, LS; IN_VDD) in an input level domain and output circuitry (MPA, MPB, $MP_{CASC}$, $MN_{CASC}$, MNO; 100D) including an output node configured to provide an output signal (OUT; OUT_S) in an output level domain. The output level domain is shifted with respect to the input level domain. The output circuitry (MPA, MPB, $MP_{CASC}$, $MN_{CASC}$, MNO; 100D) includes a first drive node (A) and a second drive node (B) configured to receive a first (PhaseACond; PhaseA_Cond_S) and a second (PhaseBCond; PhaseB_Cond_S) logical signal, respectively. The output signal (OUT; OUT_S) has a first output level or a second output level in said output level domain as a function of at least one of first (PhaseACond; PhaseA_Cond_S) and second (PhaseBCond; PhaseB_Cond_S) logical signals. A first shift capacitor ($C_{SHIFTL}$) is coupled to the first drive node (A) and a second shift capacitor ($C_{SHIFTR}$) is coupled to the second drive node (B) and capacitor refresh circuitry including a first refresh transistor (MPS_A) having a control terminal as well as a first refresh current flow path therethrough between a supply node (VX) and the first shift capacitor ($C_{SHIFTL}$) via the first drive node (A). The first refresh current flow path is configured to become conductive in response to a first refresh signal (PhaseA_S) applied to the control terminal of the first refresh transistor (MPS_A). First logic circuitry (100A) is configured to facilitate charge of the first shift capacitor ($C_{SHIFTL}$) via said first refresh current flow path in response to a first shifted refresh signal (PhaseALV; PhaseA_VDD). The first shifted refresh signal is shifted with respect to the first refresh signal (PhaseA_S)

applied to the control terminal of the first refresh transistor (MPS_A). A second refresh transistor (MPS_B) has a control terminal as well as a second refresh current flow path therethrough between a supply node (VX) and the second shift capacitor ($C_{SHIFTR}$) via the second drive node (B). The second refresh current flow path is configured to become conductive in response to a second refresh signal (PhaseB_S) applied to the control terminal of the second refresh transistor (MPS_B). Second logic circuitry (100B) is configured to facilitate charge of the second shift capacitor ($C_{SHIFTR}$) via said second refresh current flow path in response to a second shifted refresh signal (PhaseBLV; PhaseB_VDD). The second shifted refresh signal is shifted with respect to the second refresh signal (PhaseB_S) applied to the control terminal of the second refresh transistor (MPS_B).

Said first and second logic circuitry may include a first logic gate (100A) configured to receive said first shifted refresh signal (PhaseALV; PhaseA_VDD) as an input with the first shift capacitor ($C_{SHIFTL}$) intermediate the first drive node (A) and the first logic gate (100A); and a second logic gate (100B) configured to receive said second shifted refresh signal (PhaseBLV; PhaseB_VDD) as an input with the second shift capacitor ($C_{SHIFTR}$) intermediate the second drive node (B) and the second logic gate (100B).

Said first and second logic circuitry may include first and second NAND gates (100A, 100B) receiving as inputs said first shifted refresh signal (PhaseALV; Phase A_VDD) and said second shifted refresh signal (PhaseBLV; Phase B_VDD), respectively.

The circuit (10) may include a current flow line between a supply node (VX) and a reference node (GND), the current flow line including a cascaded arrangement of the parallel connection of current flow paths through a first drive transistor (MPA) and a second drive transistor (MPB), the current flow path through a first cascode transistor ($MP_{CASC}$), and the current flow path through a second cascode transistor ($MN_{CASC}$) The first (MPA) and second (MPA) drive transistors may have respective control terminals coupled to said first drive node (A) and said second drive node (B). The output node (OUT) may be located on said current flow line intermediate the first cascode transistor ($MP_{CASC}$) and the second cascode transistor ($MN_{CASC}$).

Said current flow line between a supply node (VX) and a reference node (GND) may include a current flow path through a third drive transistor (MNO) intermediate the second cascode transistor ($MN_{CASC}$) and the reference node (GND). The current flow path through the third drive transistor (MNO) may become conductive in response (100C) to said input signal (IN) being asserted.

The output circuitry may include an output logic gate (100D) having logical inputs coupled to said first drive node (A) and said second drive node (B) to receive said first and second logical signals (PhaseA_Cond_S, PhaseB_Cond_S) therefrom. The output signal (OUT_S) has said first output level or said second output level in said output level domain in response to at least one of said first and second logical signals (PhaseACond, PhaseBCond; PhaseA_Cond_S, PhaseB_Cond_S) being asserted.

Said output logic gate (100D) may be arranged between a supply node (VX) and a reference node (SHIFTED_GND). The supply node (VX) and said reference node (SHIFTED_GND) may provide said first and said second output levels in said output level domain shifted with respect to the input level domain.

Said output logic gate (100D) may include a NAND gate having logical inputs coupled to said first drive node (A) and said second drive node (B) to receive therefrom said first and second logical signals (PhaseA_Cond_S, PhaseB_Cond_S).

The capacitor refresh circuitry may be configured to make the first refresh transistor (MPS_A) and the second refresh transistor (MPS_B) conductive alternately. With the first refresh transistor (MPS_A) conductive, a first terminal of the first shift capacitor ($C_{SHIFTL}$) may be coupled to the supply node (VX) via the first drive node (A) and a second terminal of the first shift capacitor ($C_{SHIFTL}$) may be brought to a high logic value (VDD) by the first logic circuitry (100A). With the second refresh transistor (MPS_B) conductive, a first terminal of the second shift capacitor ($C_{SHIFTr}$) may be coupled to the supply node (VX) via the second drive node (B) and a second terminal of the second shift capacitor ($C_{SHIFTR}$) may be brought to a high logic value (VDD) by the second logic circuitry (100B).

The capacitor refresh circuitry may be configured to counter the first refresh transistor (MPS_A) and the second refresh transistor (MPS_B) being made conductive simultaneously.

A device may be summarized as including a circuit (10, 10') according to any of the preceding claims, and an electrical load (L) coupled to said output node in the output circuitry (MPA, MPB, $MP_{CASC}$, $MN_{CASC}$, MNO; 100D) to receive therefrom said an output signal (OUT; OUT_S) in said output level domain shifted with respect to the input level domain.

A method of operating a circuit (10, 10'), or a device may be summarized as including making the first refresh transistor (MPS_A) and the second refresh transistor (MPS_B) conductive alternately. With the first refresh transistor (MPS_A) conductive, a first terminal of the first shift capacitor (CSHIFTL) is coupled to the supply node (VX) via the first drive node (A) and a second terminal of the first shift capacitor (CSHIFTL) is brought to a high logic value (VDD) by the first logic circuitry (100A). With the second refresh transistor (MPS_B) conductive, a first terminal of the second shift capacitor (CSHIFTr) is coupled to the supply node (VX) via the second drive node (B) and a second terminal of the second shift capacitor (CSHIFTR) is brought to a high logic value (VDD) by the second logic circuitry (100B).

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
   at least one input node configured to receive an input signal in an input level domain;
   output circuitry including:
   an output node configured to provide an output signal in an output level domain, wherein the output level domain is shifted with respect to the input level domain;
   a first drive node configured to receive a first logical signal; and
   a second drive node configured to receive a second logical signal, wherein said output signal has a first output level or a second output level in said output level domain as a function of at least one of the first and second logical signals;
a first shift capacitor coupled to the first drive node;
a second shift capacitor coupled to the second drive node; and
capacitor refresh circuitry including:
a first refresh transistor having a control terminal as well as a first refresh current flow path therethrough between a supply node and the first shift capacitor via the first drive node, the first refresh current flow path configured to become conductive in response to a first refresh signal applied to the control terminal of the first refresh transistor;
first logic circuitry configured to facilitate charge of the first shift capacitor via said first refresh current flow path in response to a first shifted refresh signal, said first shifted refresh signal being shifted with respect to the first refresh signal applied to the control terminal of the first refresh transistor, the first logic circuitry including a first NAND gate configured to receive, as an input, the first shifted refresh signal;
a second refresh transistor having a control terminal and a second refresh current flow path therethrough between the supply node and the second shift capacitor via the second drive node, the second refresh current flow path configured to become conductive in response to a second refresh signal applied to the control terminal of the second refresh transistor; and
second logic circuitry configured to facilitate charge of the second shift capacitor via said second refresh current flow path in response to a second shifted refresh signal, said second shifted refresh signal being shifted with respect to the second refresh signal applied to the control terminal of the second refresh transistor, the second logic circuitry including a second NAND gate configured to receive, as an input, the second shifted refresh signal.

2. The device of claim 1, wherein said first logic circuitry includes a first logic gate configured to receive said first shifted refresh signal as an input with the first shift capacitor intermediate the first drive node and the first logic gate, wherein the second logic circuitry includes a second logic gate configured to receive said second shifted refresh signal as an input with the second shift capacitor intermediate the second drive node and the second logic gate.

3. The device of claim 1, comprising:
a current flow line between the supply node and a reference node, the current flow line including a cascaded arrangement of:
a parallel connection of current flow paths through a first drive transistor and a second drive transistor;
a current flow path through a first cascode transistor; and
a current flow path through a second cascode transistor, wherein the first and second drive transistors have respective control terminals coupled to said first drive node and said second drive node, wherein said output node is located on said current flow line intermediate the first cascode transistor and the second cascode transistor.

4. The device of claim 3, wherein said current flow line between the supply node and the reference node includes a current flow path through a third drive transistor intermediate the second cascode transistor and the reference node, said current flow path through the third drive transistor becoming conductive in response to said input signal being asserted.

5. The device of claim 1, wherein the output circuitry includes an output logic gate having logical inputs coupled to said first drive node and said second drive node to receive said first and second logical signals therefrom wherein said output signal has said first output level or said second output level in said output level domain in response to at least one of said first and second logical signals being asserted.

6. The device of claim 5, wherein said output logic gate is arranged between a supply node and a reference node, wherein said supply node and said reference node provide said first and said second output levels in said output level domain shifted with respect to the input level domain.

7. The device of claim 5, wherein said output logic gate includes a NAND gate having logical inputs coupled to said first drive node and said second drive node to receive therefrom said first and second logical signals.

8. The device of claim 1, wherein the capacitor refresh circuitry is configured to make the first refresh transistor and the second refresh transistor conductive alternately, wherein:
with the first refresh transistor conductive, a first terminal of the first shift capacitor is coupled to the supply node via the first drive node and a second terminal of the first shift capacitor is brought to a high logic value by the first logic circuitry, and
with the second refresh transistor conductive, a first terminal of the second shift capacitor is coupled to the supply node via the second drive node and a second terminal of the second shift capacitor is brought to a high logic value by the second logic circuitry.

9. The device of claim 1, wherein the capacitor refresh circuitry is configured to prevent the first refresh transistor and the second refresh transistor being made conductive simultaneously.

10. The device of claim 1, comprising an electrical load coupled to said output node in the output circuitry to receive therefrom said output signal in said output level domain shifted with respect to the input level domain.

11. A method, comprising:
receiving, with an input node of a circuit, an input signal in an input level domain;
providing, with an output node of output circuitry of the circuit, an output signal in an output level domain shifted with respect to the input level domain;
receiving, with a first drive node of the output circuitry, a first logical signal;
receiving, with a second drive node of the output circuitry, a second logical signal, wherein the output signal has a first output level or a second output level in said output level domain as a function of at least one of the first and second logical signals;
causing a first refresh current flow path of a first refresh transistor to become conductive by applying a first refresh signal to a control terminal of the first refresh transistor, the first refresh current flow path being coupled between a supply node and a first shift capacitor coupled to the first drive node;
charging, with first logic circuitry, the first shift capacitor via the first refresh current flow path in response to a first shifted refresh signal shifted with respect to the first refresh signal, the first logic circuitry including a first NAND gate receiving, as an input, the first shifted refresh signal;
causing a second refresh current flow path of a second refresh transistor to become conductive by applying a second refresh signal to a control terminal of the second refresh transistor, the second refresh current flow path being coupled between the supply node and a second shift capacitor coupled to the second drive node; and charging, with second logic circuitry, the first shift capacitor via the second refresh current flow path in response to a second shifted refresh signal shifted with respect to the second refresh signal, the second logic circuitry including a second NAND gate receiving, as an input, the second shifted refresh signal.

12. The method of claim 11, comprising alternately making the first refresh transistor and the second refresh transistor conductive.

13. The method of claim 12, wherein with the first refresh transistor conductive, a first terminal of the first shift capacitor is coupled to the supply node via the first drive node and a second terminal of the first shift capacitor is brought to a high logic value by the first logic circuitry, wherein with the second refresh transistor conductive, a first terminal of the second shift capacitor is coupled to the supply node via the second drive node and a second terminal of the second shift capacitor is brought to a high logic value by the second logic circuitry.

14. A device, comprising:
an input node configured to receive an input signal in an input level domain;
a supply terminal configured to provide a supply voltage; and
output circuitry including:
a first cascode transistor;
a second cascode transistor;
a first drive transistor coupled between the supply terminal and the first cascode transistor and having a control terminal configured to receive a first logical signal;
a first shift capacitor having a first terminal coupled to the control terminal of the first drive transistor;
a first refresh transistor coupled between the supply terminal and the first terminal of the first shift capacitor and having a control gate configured to receive a first refresh signal;
a second drive transistor coupled in parallel with the first drive transistor and having a control terminal configured to receive a second logical signal; and
a second shift capacitor having a first terminal coupled to the control terminal of the second drive transistor; and
a second refresh transistor coupled between the supply terminal and the first terminal of the second shift capacitor and having a control gate configured to receive a second refresh signal; and
an output node coupled between the first cascode transistor and the second cascode transistor and configured to provide an output signal in an output level domain shifted with respect to the input level domain.

15. The device of claim 14, comprising:
first logic circuitry coupled to a second terminal of the first shift capacitor and configured to supply to the second terminal of the first shift capacitor a first shifted refresh signal shifted with respect to the first refresh signal; and
second logic circuitry coupled to a second terminal of the second shift capacitor and configured to supply to the second terminal of the first shift capacitor a second shifted refresh signal shifted with respect to the second refresh signal.

16. The device of claim 15, wherein the first logic circuitry includes a first NAND gate and the second logic circuitry includes a second NAND gate.

17. The device of claim 14, wherein the output circuitry includes a low side driver transistor coupled between the second cascode transistor and ground.

18. The device of claim 14, comprising a load coupled to the output node.

19. A device, comprising:
at least one input node configured to receive an input signal in an input level domain;
output circuitry including:
an output node configured to provide an output signal in an output level domain, wherein the output level domain is shifted with respect to the input level domain;
a first drive node configured to receive a first logical signal; and
a second drive node configured to receive a second logical signal, wherein said output signal has a first output level or a second output level in said output level domain as a function of at least one of the first and second logical signals;
a first shift capacitor coupled to the first drive node;
a second shift capacitor coupled to the second drive node;
capacitor refresh circuitry including:
a first refresh transistor having a control terminal as well as a first refresh current flow path therethrough between a supply node and the first shift capacitor via the first drive node, the first refresh current flow path configured to become conductive in response to a first refresh signal applied to the control terminal of the first refresh transistor;
first logic circuitry configured to facilitate charge of the first shift capacitor via said first refresh current flow path in response to a first shifted refresh signal, said first shifted refresh signal being shifted with respect to the first refresh signal applied to the control terminal of the first refresh transistor;
a second refresh transistor having a control terminal and a second refresh current flow path therethrough between the supply node and the second shift capacitor via the second drive node, the second refresh current flow path configured to become conductive in response to a second refresh signal applied to the control terminal of the second refresh transistor; and
second logic circuitry configured to facilitate charge of the second shift capacitor via said second refresh current flow path in response to a second shifted refresh signal, said second shifted refresh signal being shifted with respect to the second refresh signal applied to the control terminal of the second refresh transistor; and
a current flow line between the supply node and a reference node, the current flow line including a cascaded arrangement of:
a parallel connection of current flow paths through a first drive transistor and a second drive transistor;
a current flow path through a first cascode transistor; and
a current flow path through a second cascode transistor, wherein the first and second drive transistors have respective control terminals coupled to said first drive node and said second drive node, wherein said output node is located on said current flow line intermediate the first cascode transistor and the second cascode transistor.

20. A device, comprising:
at least one input node configured to receive an input signal in an input level domain;
output circuitry including:
an output node configured to provide an output signal in an output level domain, wherein the output level domain is shifted with respect to the input level domain;
a first drive node configured to receive a first logical signal; and
a second drive node configured to receive a second logical signal, wherein said output signal has a first output level or a second output level in said output level domain as a function of at least one of the first and second logical signals;
an output logic gate having logical inputs coupled to said first drive node and said second drive node to receive said first and second logical signals therefrom, wherein said output signal has said first output level or said second output level in said output level domain in response to at least one of said first and second logical signals being asserted;
a first shift capacitor coupled to the first drive node;
a second shift capacitor coupled to the second drive node; and
capacitor refresh circuitry including:
a first refresh transistor having a control terminal as well as a first refresh current flow path therethrough between a supply node and the first shift capacitor via the first drive node, the first refresh current flow path configured to become conductive in response to a first refresh signal applied to the control terminal of the first refresh transistor;
first logic circuitry configured to facilitate charge of the first shift capacitor via said first refresh current flow path in response to a first shifted refresh signal, said first shifted refresh signal being shifted with respect to the first refresh signal applied to the control terminal of the first refresh transistor;
a second refresh transistor having a control terminal and a second refresh current flow path therethrough between the supply node and the second shift capacitor via the second drive node, the second refresh current flow path configured to become conductive in response to a second refresh signal applied to the control terminal of the second refresh transistor; and
second logic circuitry configured to facilitate charge of the second shift capacitor via said second refresh current flow path in response to a second shifted refresh signal, said second shifted refresh signal being shifted with respect to the second refresh signal applied to the control terminal of the second refresh transistor.

21. A device, comprising:
an input node configured to receive an input signal in an input level domain;
a supply terminal configured to provide a supply voltage; and
output circuitry including:
a first cascode transistor;
a second cascode transistor;
a low side driver transistor coupled between the second cascode transistor and ground;
a first drive transistor coupled between the supply terminal and the first cascode transistor and having a control terminal configured to receive a first logical signal;
a second drive transistor coupled in parallel with the first drive transistor and having a control terminal configured to receive a second logical signal; and
an output node coupled between the first cascode transistor and the second cascode transistor and configured to provide an output signal in an output level domain shifted with respect to the input level domain.

* * * * *